(12) United States Patent
Czubarow et al.

(10) Patent No.: US 9,670,377 B2
(45) Date of Patent: Jun. 6, 2017

(54) UNDERFILL COMPOSITION FOR ENCAPSULATING A BOND LINE

(71) Applicant: NAMICS CORPORATION, Niigata-shi, Niigata (JP)

(72) Inventors: Pawel Czubarow, Wellesley, MA (US); Toshiyuki Sato, Niigata (JP); Tsutomu Masuko, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 14/196,581

(22) Filed: Mar. 4, 2014

(65) Prior Publication Data

US 2015/0252217 A1 Sep. 10, 2015

(51) Int. Cl.
*C08K 3/04* (2006.01)
*C08K 3/28* (2006.01)
(Continued)

(52) U.S. Cl.
CPC ....... *C09D 163/00* (2013.01); *C08G 59/5033* (2013.01); *C08K 3/04* (2013.01);
(Continued)

(58) Field of Classification Search
CPC ..... C08L 63/00–63/10; C09D 163/00–163/10; C08K 2003/282; C08K 2003/2296; C08K 3/22; C08K 3/04; C08K 3/28; C08K 3/34; C08K 3/38; C09J 163/00–163/10; H01L 21/563; H01L 2924/00; H01L 2924/01004; H01L 2924/01012; H01L 2924/0103; H01L 2924/014; H01L 2224/83101; H01L 2224/83102; H01L 2224/93125; H01L 2224/29387; H01L 2224/29499; H01L 2924/0493; H01L 2924/05032;
(Continued)

(56) References Cited

U.S. PATENT DOCUMENTS 5,714,238 A * 2/1998 Komagata ............ C08G 65/327
156/330
6,323,263 B1 11/2001 Kuwabata et al.
(Continued)

FOREIGN PATENT DOCUMENTS

JP 05-206333 8/1993
JP 07-26061 1/1995
(Continued)

OTHER PUBLICATIONS

Matweb Alumina Data Sheet, www.matweb.com (no date).*
Machine translation of JP 2007-169445 A.*

*Primary Examiner* — Kregg Brooks
(74) *Attorney, Agent, or Firm* — Hamre, Schumann, Mueller & Larson, P.C.

(57) ABSTRACT

An underfill composition for encapsulating a bond line and a method of using the underfill composition are described. Advantageously, the disclosed underfill composition in an uncured state has a fluidity value of less than about ten minutes over about a two centimeter distance at a temperature of about 90 degrees C. and at a bond line thickness of about 50 microns or less and still have a bulk thermal conductivity that is greater than about 0.8 W/mK in the cured state.

19 Claims, 4 Drawing Sheets

(51) Int. Cl.

| | |
|---|---|
| C08L 63/00 | (2006.01) |
| C09D 163/00 | (2006.01) |
| H01L 21/56 | (2006.01) |
| H01L 23/00 | (2006.01) |
| H01L 23/29 | (2006.01) |
| C08K 3/22 | (2006.01) |
| C08K 3/38 | (2006.01) |
| H01L 25/065 | (2006.01) |
| C08K 3/34 | (2006.01) |
| C08G 59/50 | (2006.01) |

(52) U.S. Cl.
CPC .......... *C08K 3/22* (2013.01); *C08K 3/28* (2013.01); *C08K 3/34* (2013.01); *C08K 3/38* (2013.01); *C08L 63/00* (2013.01); *H01L 23/295* (2013.01); *H01L 24/29* (2013.01); *H01L 25/0652* (2013.01); *C08K 2003/282* (2013.01); *C08K 2201/003* (2013.01); *H01L 21/563* (2013.01); *H01L 24/13* (2013.01); *H01L 24/16* (2013.01); *H01L 24/32* (2013.01); *H01L 24/83* (2013.01); *H01L 2224/131* (2013.01); *H01L 2224/16227* (2013.01); *H01L 2224/2732* (2013.01); *H01L 2224/2929* (2013.01); *H01L 2224/29291* (2013.01); *H01L 2224/29294* (2013.01); *H01L 2224/29387* (2013.01); *H01L 2224/29391* (2013.01); *H01L 2224/29499* (2013.01); *H01L 2224/32225* (2013.01); *H01L 2224/73204* (2013.01); *H01L 2224/83101* (2013.01); *H01L 2224/83102* (2013.01); *H01L 2224/83862* (2013.01); *H01L 2224/92125* (2013.01); *H01L 2924/12042* (2013.01); *H01L 2924/15311* (2013.01); *H01L 2924/182* (2013.01)

(58) Field of Classification Search
CPC . H01L 2924/05042; H01L 2924/05342; H01L 2924/0542; H01L 2924/05432; H01L 2924/0665; H01L 2924/182
See application file for complete search history.

(56) References Cited

U.S. PATENT DOCUMENTS

| | | | | |
|---|---|---|---|---|
| 2002/0089071 | A1* | 7/2002 | Sumita | C08L 63/00 257/793 |
| 2003/0218258 | A1* | 11/2003 | Charles | H01L 21/563 257/783 |
| 2009/0018239 | A1* | 1/2009 | Woods | C08G 59/1455 523/459 |
| 2012/0025399 | A1* | 2/2012 | Takamoto | C08K 3/22 257/778 |
| 2014/0027885 | A1 | 1/2014 | Kawase et al. | |

FOREIGN PATENT DOCUMENTS

| | | | |
|---|---|---|---|
| JP | 2001-200139 | | 7/2001 |
| JP | 2001-220495 | | 8/2001 |
| JP | 2007169445 A | * | 7/2007 |
| JP | 2008-088378 | | 4/2008 |
| JP | 2009-203292 | | 9/2009 |
| JP | 2012-216838 | | 11/2012 |
| JP | 2012-224799 | | 11/2012 |

* cited by examiner

UNDERFILL COMPOSITION FOR ENCAPSULATING A BOND LINE

FIELD

This disclosure generally relates to encapsulant materials used in electronic devices, and particularly, to underfill compositions for encapsulating a bond line and methods of using the underfill compositions.

BACKGROUND

In general, encapsulant materials such as underfill compositions can be used to provide mechanical enforcement between a semiconductor die, e.g., an integrated circuit (IC) die, and a substrate to form a package, e.g., an IC package. In IC packages such as a "flip chip" semiconductor device, a ball grid array (BGA) or a bump array, which can exploit the full surface area of the chip, is provided on a face of the die and bonded directly to solder connections on the substrate. The underfill composition provides mechanical enforcement between the die and the substrate by filling in the space between solder balls of the BGA or the bump array and then being cured. In addition to providing mechanical enforcement between the die and the substrate, the underfill composition can function to enhance the heat conduction out of the device when in the cured state.

SUMMARY

An underfill composition for encapsulating a bond line and a method of using the underfill composition are described. The underfill composition can be used to encapsulate a bond line, for example, between a semiconductor die and a substrate where a thickness of the bond line is about 50 microns or less, alternatively about 50 microns or less and about 10 microns or more, alternatively about 40 microns or less, alternatively about 30 microns or less, alternatively about 20 microns, alternatively about 20 microns or less and about 10 microns or more. In some examples, the underfill composition is a pre-applied underfill composition or a molded underfill composition. In some examples, the underfill composition is a capillary underfill composition. In some examples, the capillary underfill composition is applied in an uncured state, and has a fluidity value that is less than about ten minutes over about a two centimeter distance at a temperature of about 90 degrees C. In some examples, the cured underfill composition has a bulk thermal conductivity that is greater than about 0.8 W/mK.

In each of all instances as described herein, the term "about" for the bond line thickness indicates, for example, a margin of error of ±5 microns. In each of all instances as described herein, the term "about" for the temperature of the fluidity value indicates, for example, a margin of error of ±5 degrees. In each of all instances as described herein, the term "about" for the distance traveled for the fluidity value indicates, for example, a margin of error of ±0.5 centimeters. In each of all instances as described herein, the term "about" for the time taken to travel a predetermined distance for the fluidity value indicates, for example, a margin of error of ±one minute. In each of all instances as described herein, the term "about" for the bulk thermal conductivity indicates, for example, a margin of error of ±0.2 W/mK.

The terms "uncured underfill composition" or "underfill composition in an uncured state", "cured underfill composition" or "underfill composition in a cured state", "bond line", and "fluidity value" are described as follows.

In general, an underfill composition is utilized in an assembly, for example, a flip chip semiconductor device, that includes a semiconductor die and a substrate. During the manufacturing process of the assembly, the semiconductor die is bonded to the substrate such that there is a space between the semiconductor die and the substrate, and thereafter, the underfill composition is applied in an uncured state in the space between the semiconductor die and the substrate. The space between the semiconductor die and the substrate is referred to as a "bond line".

In general, an uncured underfill composition is in a liquid state. In some instances, the underfill composition is a capillary underfill composition so that the uncured underfill composition is capable of flowing in the space between the semiconductor die and the substrate by capillary action. One measure for the capability of an underfill composition to flow via capillary action is a fluidity value, which is expressed in terms of an amount of time over a certain distance at a certain temperature relative to a certain thickness of a bond line.

In some examples, after the capillary underfill composition is provided in the uncured state by capillary action in the bond line, the underfill composition is cured, for example, by heating. The cured underfill composition is typically in a solid state.

The general trend in the electronic industry has been to reduce the dimensional scale of the features of semiconductor devices, e.g., a reduction in the thickness of the bond lines as a result of reduction in size of ball grid arrays (BGAs) and increased amount of BGAs. However, as the thicknesses of the bond lines become smaller, a bottleneck in the overall manufacturing process of the semiconductor device may arise due to the capillary action of the underfill composition becoming excessively slow. Also, properties such as bulk thermal conductivity of the underfill composition in the cured state may become diminished.

The present inventors have found that the disclosed underfill composition in an uncured state can achieve a superior fluidity value at a bond line of about 20 microns or less and still have a superior bulk thermal conductivity in the cured state.

In one embodiment, the uncured underfill composition generally includes an epoxy resin, a curing agent and a plurality of filler particles. In some examples, the uncured underfill composition is in a liquid state at room temperature. The term "liquid state at room temperature" means that the underfill composition has a viscosity of about 0.1 to about 150 Pas at about 10 to about 35 degrees C.

In some examples, the uncured underfill composition is a capillary underfill. In some examples, the uncured underfill composition is formulated and configured so that it has a fluidity value of less than about ten minutes over about a two centimeter distance at a temperature of about 90 degrees C. and at a bond line having a thickness of about 20 microns or less.

In some examples, the underfill composition in the cured state has a bulk thermal conductivity of greater than about 0.8 W/mK. In some examples, the bulk thermal conductivity of the cured underfill composition is measured after the uncured underfill composition is cured, for example, by heating the uncured underfill composition for about one hour at between about 140 degrees C. and about 150 degrees C. In some examples, full curing takes place at about 165 degrees C. for about one hour. In some examples, the cured state of the underfill composition is a solid at room temperature, e.g., at about 10 to about 35 degrees C.

In some examples, the filler particles included in the underfill composition has a maximum particle size of about 3 microns. In each of all instances as described herein, the term "about" for the particle sizes indicates, for example, a margin of error of ±0.02 microns.

In some examples, the filler particles included in the underfill composition has a bimodal or trimodal particle size distribution.

The term "particle size distribution" generally refers to the relative amount(s) of the particles present according to size.

The term "bimodal particle size distribution" means that the distribution of particles according to size is predominantly of two defined particle sizes that are different from one another. A bimodal particle size distribution can be generated, for example, by mixing two populations of particles that have D50 particle size distributions that are different from one another. For instance, one population of particles can have a D50 particle size distribution of P1, while the other population of particles can have a D50 particle size distribution of P2, where P1≠ P2. When the two populations of particles are mixed together, the mixture would include particles that are predominantly distributed into two defined particle sizes, namely, P1 and P2. The "D50 particle size distribution" is the size that splits the distribution with half above and half below the given diameter. The meaning of "D50 particle size distribution" is defined in *A Guidebook to Particle Size Analysis*, HORIBA Instruments, Inc., 2012, which is herein incorporated by reference.

The term "trimodal particle size distribution" means that the distribution of particles according to size is predominantly of three defined particle sizes that are different from one another. A trimodal particle size distribution can be generated, for example, by mixing three populations of particles that have D50 particle size distributions that are different from one another. For instance, a first population of particles can have a D50 particle size distribution of P1, a second population of particles can have a D50 particle size distribution of P2, and a third population of particles can have a D50 particle size distribution of P3, where P1≠P2≠P3. When the three populations of particles are mixed together, the mixture would include particles that are predominantly distributed into three defined particle sizes, namely, P1, P2 and P3.

In some examples, the filler particles included in the underfill composition has a bimodal particle size distribution and are a blend of first and second populations of particle sizes that have respective D50 particle size distributions of about 0.5 microns and about 2.5 to about 3.0 microns. In some examples, where the total volume of the underfill composition sums to a volume fraction of 100%, the first population of filler particles can have a volume fraction of about 5% to about 10%, alternately about 2% to about 7%, alternately about 7% to about 35%, alternately about 10% to about 20% and the second population of particles can have a volume fraction of about 7% to about 20%, alternately about 10% to about 20%, alternately about 7% to about 35%.

In some examples, the filler particles included in the underfill composition has a trimodal particle size distribution and are a blend of first, second and third populations of particles that have respective D50 particle size distribution of about 0.1 microns, about 0.5 microns, about 2.5 to about 3.0 microns. In some examples, where the total volume of the underfill composition sums to a volume fraction of 100%, the first population of filler particles can have a volume fraction of about 5 to about 10%, the second population of filler particles can have a volume fraction of about 7% to about 35% and the third population of particles can have a volume fraction of about 10% to about 35%.

In some examples, an amount of the filler particles that can be included in the underfill composition can be about 30% by weight to about 80% by weight, alternately about 50% by weight to about 70% by weight based on the total weight of the composition.

In some examples, the filler particles included in the underfill composition has an electrical resistance of greater than about $10^{12}$ Ohm·cm, alternately, between about $10^{10}$ Ohm·cm to about $10^{15}$ Ohm·cm. In each of all instances as described herein, the term "about" for the electrical resistance indicates, for example, a margin of error of $\pm 10^{2}$ Ohm·cm.

In some examples, the filler particles included in the underfill composition are made of an oxide. In some instances, the oxide can be a metal oxide. In some examples, the oxide can include, but is not limited to, aluminum oxide, zinc oxide, beryllium oxide, zirconium oxide, magnesium oxide and mixtures thereof.

In some examples, the filler particles included in the underfill composition are dimensioned so that the particles have an aspect ratio of about one.

In some examples, the filler particles included in the underfill composition are dimensioned so that the filler particles are substantially spherical in shape.

In some examples, the filler particles included in the underfill composition are dimensioned so that the filler particles are substantially cubical in shape with rounded corners.

In one embodiment, the underfill composition described herein is provided in an assembly, for example, an assembly that includes a semiconductor die and a substrate to which the die is connected.

The semiconductor die can be any die that is suitable for use in an electronic device, for example, an IC die, an LSI die, a VLSI die and the like.

The substrate likewise can be any substrate that is suitable for use in an electronic device, for example, a glass-epoxy substrate (e.g., a FR-4 substrate), an aramid substrate, a polyimide substrate, a metal substrate (e.g., a silicon substrate as a semiconductor), a ceramic substrate and the like.

In some examples, a bond line is formed between the semiconductor die and the substrate, and the underfill composition is provided in the bond line. In some instances, the bond line has a thickness of about 20 microns or less.

In one embodiment, the assembly is a flip chip semiconductor device. In some examples, the flip chip semiconductor device includes a ball grid array (BGA) or a bump array on a face of the semiconductor die. In some examples, the BGA or the bump array includes solder balls or other connection bumps. In some instances, the BGA or the bump array is directly connected to the substrate. In general, the BGA or the bump array can exploit the full area of the device for a relatively high number of electrical connections, i.e., inputs/outputs (I/Os), in the device. In some examples, the underfill composition is provided in the spaces between the solder balls of the BGA or the bump array and encapsulates the bond line.

In one embodiment, the disclosed method for encapsulating a bond line includes assembling the semiconductor die and the substrate so that the semiconductor die is connected to the substrate and then allowing the underfill composition to flow in the space between the die and substrate, e.g., by capillary action. In some examples, the underfill composition that is provided in the space between the die and substrate is cured so as to encapsulate the bond line.

Other aspects of the disclosed composition and method will become apparent by consideration of the detailed description and accompanying drawings.

DETAILED DESCRIPTION

Figure 1:
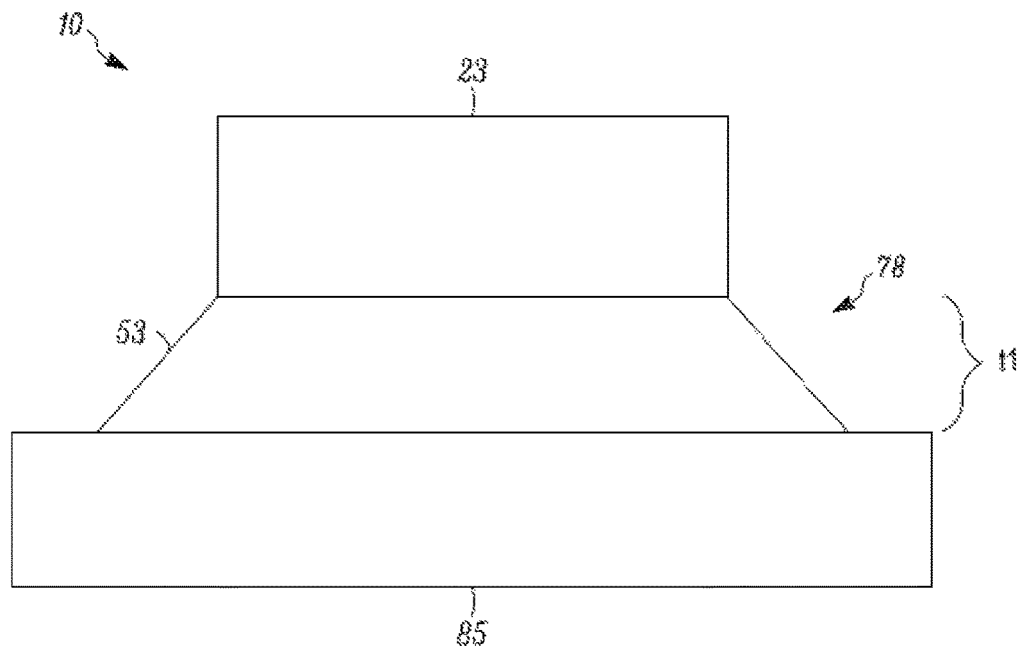
FIG. 1 is a schematic drawing of an assembly that includes the disclosed underfill composition, according to one embodiment.

An underfill composition for encapsulating a bond line and a method of using the underfill composition are described. Advantageously, the disclosed underfill composition in an uncured state can achieve a superior fluidity value at a bond line of about 20 microns or less and still have a superior bulk thermal conductivity in the cured state.

In one embodiment, the underfill composition includes an epoxy resin, a curing agent and a plurality of filler particles. Each of the components is described in detail below.

Epoxy Resin

The epoxy resin included in the underfill composition can be any epoxy resin that is suitable for use in a semiconductor device.

In some examples, the epoxy resin has at least two epoxy groups in the molecule and becomes a resinous state after curing. In some examples, the epoxy resin may be in a liquid state at a normal temperature, e.g., about 10 degrees C. to about 35 degrees C. In some examples, the epoxy resin itself may be in a solid state at a normal temperature, e.g., about 10 degrees C. to about 35 degrees C. In some instances, the epoxy resin in the solid state may be dissolved in other liquid epoxy resins or a diluent at a normal temperature, e.g., about 10 degrees C. to about 35 degrees C. Examples of the epoxy resin can include, but is not limited to, a bisphenol A type epoxy resin, brominated bisphenol A type epoxy resin, bisphenol F type epoxy resin, biphenyl type epoxy resin, novolac type epoxy resin, alicyclic epoxy resin, naphthalene type epoxy resin, ether series or polyether series epoxy resin, oxirane ring-containing polybutadiene, silicone epoxy copolymer resin, etc.

In some examples, as an epoxy resin which is in a liquid state at a normal temperature, e.g., about 10 degrees C. to about 35 degrees C., there may be used a bisphenol A type epoxy resin having a weight average molecular weight (Mw) of about 400 or less; branched polyfunctional bisphenol A type epoxy resin such as p-glycidyloxyphenyldimethyltrisbisphenol A diglycidyl ether; bisphenol F type epoxy resin; phenol novolac type epoxy resin having a weight average molecular weight (Mw) of about 570 or less; alicyclic epoxy resin such as vinyl(3,4-cyclo-hexene)dioxide, (3,4-epoxycyclohexyl)methyl 3,4-epoxycyclohexylcarboxylate, bis(3,4-epoxy-6-methylcyclohexylmethyl)adipate and 2-(3,4-epoxycyclohexyl) 5,1-spiro(3,4-epoxycyclohexyl)-m-dioxane; biphenyl type epoxy resin such as 3,3',5,5'-tetramethyl-4,4'-diglycidyloxybiphenyl; glycidyl ester type epoxy resin such as diglycidyl hexahydrophthalate, diglycidyl 3-methylhexahydrophthalate and diglycidyl hexahydroterephthalate; glycidyl amine type epoxy resin such as diglycidylaniline, diglycidyltoluidine, triglycidyl-p-aminophenol, tetraglycidyl-m-xylylenediamine and tetraglycidylbis(aminomethyl)cyclohexane; hydantoin type epoxy resin such as 1,3-diglycidyl-5-methyl-5-ethylhydantoin; and naphthalene ring-containing epoxy resin. In addition, an epoxy resin having silicone skeletone such as 1,3-bis(3-glycidoxypropyl)-1,1,3,3-tetramethyldisiloxane may be used. Moreover, there may be exemplified by a diepoxide compound such as (poly)ethylene glycol diglycidyl ether, (poly)propylene glycol diglycidyl ether, butanediol diglycidyl ether and neopentylglycol diglycidyl ether; and a triepoxide compound such as trimethylolpropane triglycidyl ether and glycerin triglycidyl ether.

In some examples, a solid state or ultra-high viscosity epoxy resin at a normal temperature in combination with the above-mentioned epoxy resins can be used. Examples of which can include a bisphenol A type epoxy resin, novolac epoxy resin and tetrabromobisphenol A type epoxy resin each of which has a higher molecular weight. These epoxy resins may be used in combination with the epoxy resin which is in a liquid state at a normal temperature, e.g., about 10 degrees C. to about 35 degrees C. and/or a diluent to control a viscosity of the mixture. When the solid state or ultra-high viscosity epoxy resin at a normal temperature, e.g., about 10 degrees C. to about 35 degrees C., is used, it is preferably used in combination with an epoxy resin having a low viscosity at a normal temperature, e.g., about 10 degrees C. to about 35 degrees C., such as diepoxide compounds including (poly)ethylene glycol diglycidyl ether, (poly)propylene glycol diglycidyl ether, butanediol diglycidyl ether and neopentylglycoldiglycidyl ether; and a triepoxide compound including trimethylolpropane triglycidyl ether and glycerin triglycidyl ether.

When a diluent is used, there may be used either a non-reactive diluent or a reactive diluent can be used. In the present specification, the reactive diluent means a compound having an epoxy group and having a relatively low viscosity at a normal temperature, which may further have other polymerizable functional group(s) than the epoxy group, including an alkenyl group such as vinyl and allyl; unsaturated carboxylic acid residue such as acryloyl and methacryloyl. Examples of such a reactive diluent may be mentioned are a monoepoxide compound such as n-butylglycidyl ether, 2-ethylhexyl glycidyl ether, phenyl gylcidyl ether, cresyl glycidyl ether, p-s-butylphenyl glycidyl ether, styrene oxide and a-pinene oxide; other monoepoxide compound having other functional group(s) such as allyl glycidyl ether, glycidyl methacrylate, glycidyl acrylate and 1-vinyl-3,4-epoxycyclohexane; a diepoxide compound such as (poly)ethylene glycol diglycidyl ether, (poly)propylene glycol diglycidyl ether, butanediol diglycidyl ether and neopentyl glycol diglycidyl ether; and a triepoxide compound such as trimethylolpropane triglycidyl ether and glycerin triglycidyl ether.

The epoxy resin may be used singly or in combination of two or more kinds. In some examples, the epoxy resin itself is in a liquid state at a normal temperature, e.g., about 10 degrees C. to about 35 degrees C. Of these, examples can include a liquid state bisphenol type epoxy, liquid state aminophenol type epoxy, silicone-modified epoxy and naphthalene type epoxy. In some examples, a liquid state bisphenol A type epoxy resin, liquid state bisphenol F type epoxy resin, p-aminophenol type liquid state epoxy resin and/or 1,3-bis(3-glycidoxypropyl)tetramethyl disiloxane can be used.

In some examples, an amount of the epoxy resin in the underfill composition can be about 5% by weight to about 70% by weight, alternately about 7% by weight to about 30% by weight based on the total weight of the composition.

Curing Agent

The curing agent included in the disclosed underfill composition can be any curing agent that is suitable for use in a semiconductor device.

In some examples, the curing agent can be, but is not limited to, a phenol resin, acid anhydride series curing agent, aromatic amines and/or imidazole derivatives. The phenol resin can be, for example, a phenol novolac resin, cresol novolac resin, naphthol-modified phenol resin, dicyclopenadiene-modified phenol resin and p-xylene-modified phenol resin. The acid anhydride may be mentioned methyltetrahydrophthalic anhydride, methylhexahydrophthalic anhydride, alkylated tetrahydrophthalic anhydride, hexahydrophthalic anhydride, methylhymic anhydride, dodecenyl succinic anhydride and/or methylnadic anhydride. The aromatic amine can be, for example, methylene dianiline, m-phenylene diamine, 4,4'-diaminodiphenylsulfone and/or 3,3'-diaminodiphenylsulfone. In some examples, the curing agent can include a liquid state phenol resin such as an allylic phenol novolac resin.

An amount of the curing agent in the underfill composition can be about 0.3 to about 1.5 equivalents, more preferably about 0.6 to about 1.0 equivalents based on 1 equivalent of the epoxy group in the epoxy resin.

Filler Particles

The filler particles included in the disclosed underfill composition are generally configured to allow the underfill composition to have the following properties: (1) a fluidity value that is less than about ten minutes over about a two centimeter distance at a temperature of about 90 degrees C. when in the uncured state, and (2) a bulk thermal conductivity that is greater than about 0.8 W/mK when in the cured state.

In one example, the filler particles are made of inorganic material. In some examples, the filler particles can include an oxide, a nitride and/or diamond.

In some examples, the nitride used can be an aluminum nitride, boron nitride, silicon nitride or mixture thereof. In some examples, the oxide used can be a metal oxide. Examples of an oxide that can be used include, but are not limited to, aluminum oxide, zinc oxide, beryllium oxide, zirconium oxide, magnesium oxide and mixtures thereof. Preferably, the oxide used is magnesium oxide and/or beryllium oxide.

In some examples, the filler particles included in the underfill composition has particle sizes between about 0.5 microns and about 3 microns. In some examples, the maximum particle size of the filler particles included in the underfill composition is about 2.5 to about 3 microns. In some examples, the minimum particle size of the filler particles included in the underfill composition is about 0.5 microns. The sizes of the particles can be measured by using Scanning Electron Microscopy (SEM). In this instance, the diameter is measured as viewed from a top view of the particle, and the thickness is measured as viewed in cross-sectional side view of the particle.

In some examples, the filler particles included in the underfill composition has a bimodal or trimodal particle size distribution. In some examples, the term "particle size distribution" refers to the relative amounts of the particles present according to size, where a bimodal particle distribution refers to relative amounts of particles that are predominantly of two different particle sizes and a trimodal particle distribution refers to relative amounts of particles that are predominantly of three different particle sizes. In some examples, the particle size distribution of the filler particles can be measured using laser diffraction as is generally known in the art. In this instance, laser diffraction measures particle size distributions, for example, by measuring the angular variation in intensity of light scattered as a laser beam passes through a dispersed particulate sample.

In some examples, a bimodal particle size distribution of the filler particles can be prepared by mixing two separate batches of filler particles having D50 particle size distributions that are different from one another.

In some examples, the filler particles included in the underfill composition having a bimodal particle size distribution are a blend of first and second batches of particles that have respective D50 particle size distributions of about 0.5 microns and about 2.5 to about 3.0 microns. In some examples, where the total volume of the underfill composition sums to a volume fraction of 100%, the first population of filler particles can have a volume fraction of about 5% to about 10%, alternately about 2% to about 7%, alternately about 7% to about 35%, alternately about 10% to about 20% and the second population of particles can have a volume fraction of about 7% to about 20%, alternately about 10% to about 20%, alternately about 7% to about 35%.

In each of all instances as described herein, the term "about" for the volume fraction indicates, for example, a margin of error of ±5%.

In some examples, a trimodal particle size distribution of the filler particles can be prepared by mixing three separate batches of filler particles having D50 particle size distributions that are different from one another.

In some examples, the filler particles included in the underfill composition has a trimodal particle size distribution and are a blend of first, second and third populations of particles that have respective D50 particle size distributions of about 0.1 microns, about 0.5 microns, about 2.5 to about 3.0 microns. In some examples, the filler particles included in the underfill composition has a trimodal particle size distribution and are a blend of first, second and third populations of particles that have respective D50 particle size distributions of about 0.1 microns, about 0.5 microns, about 2.5 to about 3.0 microns. In some examples, where the total volume of the underfill composition sums to a volume fraction of 100%, the first population of filler particles can have a volume fraction of about 5 to about 10%, the second population of filler particles can have a volume fraction of about 7% to about 35% and the third population of particles can have a volume fraction of about 10% to about 35%.

In some examples, the amount of the filler particles used can depend on the type of material utilized. The following table provides some examples of the amounts that can be used for certain types of materials included in the filler particles.

| Filler | particle size | vol % range |
| --- | --- | --- |
| ZnO | ~0.2 um | ~5 to ~10 |
| ZnO | ~0.3 um | ~5 to ~10 |
| ZnO | ~0.1 um | ~5 to ~10 |
| ZnO | ~2.0 um | ~7 to ~15 |
| MgO | ~1.0 um | ~10 to ~20 |

-continued

| Filler | particle size | vol % range |
|---|---|---|
| ZrO2 | ~0.09 um | ~2 to ~7 |
| AlN | ~1.0 um | ~7 to ~35 |
| diamond | ~1 to ~3 um | ~10 to ~20 |

In some examples, the filler particles included in the underfill composition has an electrical resistance of greater than about $10^{12}$ Ohm·cm, alternately, between about $10^{10}$ Ohm·cm to about $10^{15}$ Ohm·cm. In general, the electrical resistance of the filler particles can be measured by using a Super Megaohm Meter, e.g., SME-8220.

In some examples, the filler particles included in the underfill composition are dimensioned so that the particles have an aspect ratio of about one. The aspect ratio can be measured using SEM as is generally known in the art.

In some examples, the filler particles included in the underfill composition are dimensioned so that the filler particles are substantially spherical in shape. The shape of the particles can be determined by using SEM, as is generally known in the art.

In some examples, the filler particles included in the underfill composition are dimensioned so that the filler particles are substantially cubical in shape with rounded corners.

In some examples, the filler particles have a bulk thermal conductivity of greater than about 20 W/mK. The bulk thermal conductivity can be measured using laser flash or xenon flash, as is generally known the art.

In some examples, the filler particles that can be used are commercially available filler particles, and can include, but are not limited to, LP Zinc-2 (2 micron ZnO made by Sakai Chemical Industry), LP Zinc-5 (5 micron ZnO made by Sakai Chemical Industry), Tokuyama H ALN (1.07-1.17 micron AlN made by Tokuyama), MA4 (1-3 um Diamond made by Engis), SMO-S-1 (1 micron MgO made by Sakai Chemical Industry), Kadox 930 (0.3 micron ZnO made by Horsehead Corporation), LP Zinc-11 (11 micron ZnO made by Sakai Chemical Industry), Disperbyxk111 (made by BYK Chmie), K-Sparse 5100 (made by King Industries), K-flex XMB-301 (made by King Industries), K-flex 7301 (made by King Industries), Disperbyk 180 (made by BYK Chmie), ZrO2 TOSOH TZ-3YS-E (~0.9 um ZrO2 made by Tosoh), Kadox 911 ZnO (0.1 um ZnO made by Horsehead Corporation), Kadox 920 (0.2 um ZnO made by Horsehead Corporation) and the like. Note that Disperbyxk111, K-Sparse 5100, K-flex XMB-301, K-flex 7301 and Disperbyk 180 are wetting and/or dispersing agents.

An amount of the filler particles that can be included in the underfill composition can be about 30% by weight to about 80% by weight, alternately about 50% by weight to about 70% by weight based on the total weight of the composition.

Other Components

In some examples, components other than the epoxy resin, the curing agent and the filler particles may be added in the underfill composition.

In one example, an elastomer may be added to the composition in an amount sufficient to relax a level of stress. As the elastomer, there may be mentioned a butadiene series rubber such as polybutadiene rubber, styrene-butadiene rubber and acrylonitrilebutadiene rubber; polyisoprene rubber; an ethylene propylene series rubber such as an ethylene propylene diene copolymer and an ethylene propylene copolymer; chloroprene rubber; butyl rubber; polynorbornene rubber; silicone rubber; a polar group-containing rubber such as ethylene acrylic rubber, acrylic rubber, propylene oxide rubber and urethane rubber; and a fluorine rubber such as vinylidene fluoride-propylene hexafluoride copolymer and tetrafluoroethylene-propylene copolymer. A solid elastomer can be used and the form is not particularly limited. When it is in particulate form, the mean particle size is about 10 to about 200 nm, alternately about 30 to about 150 nm, alternately about 80 to about 120 nm. As used herein, the mean particle size is a value determined by the dynamic light scattering type particle size distribution meter. An elastomer which is liquid at the normal temperature may be used. Specifically, there may be mentioned polybutadiene, butadiene acrylonitrile copolymer, polyisoprene, polypropylene oxide and polydiorganosiloxane, each of which has a relatively low average molecular weight (for example, a weight-average molecular weight of less than 8000). Moreover, an elastomer having a functional group that reacts with the epoxy group (for example, carboxyl group) at the end may be used, and it may be taken in any form either in solid form or liquid form.

The elastomer may be used in an amount of about 20 parts by weight or less, for example, about 0.1 to about 15 parts by weight, alternately about 1 to about 10 parts by weight, based on 100 parts by weight of the total amounts of the composition, in terms of obtaining good viscosity of the composition, compatibility or dispersibility with the epoxy resin, properties of the cured material. An elastomer may be used alone or in combination of two or more kinds.

A surfactant may be added to the composition of the disclosed underfill composition, in order to obtain good workability. The surfactant may be an anionic surfactant, a cationic surfactant, a nonionic surfactant or an amphoteric surfactant. A nonionic surfactant can be used. As the nonionic surfactant, there may be mentioned a polyoxyalkylene-containing nonionic surfactant such as a polyoxyethylene alkylether, polyoxyethylene alkyl arylether, an alkylallylformaldehyde condensed polyoxyethylene ether, a block polymer having polyoxypropylene as lipophilic group, a polyoxyethyene-polyoxypropylene block copolymer, a polyoxyethylene fatty acid ester, a polyoxyethylene glycerol fatty acid ester, a polyoxyethylene sorbitan fatty acid ester, a polyoxyethylene sorbitol fatty acid ester, a polyoxyethylene fatty acid amide; a siloxane-containing nonionic surfactant such as a polyoxyalkylene-modified polysiloxane; an ester type surfactant such as a glycerol fatty acid ester, a polyglycerol fatty acid ester, a sorbitan fatty acid ester, a propylene glycol fatty acid ester, a sucrose fatty acid ester; a nitrogen-containing type surfactant such as a fatty acid alkanol amide. In particular, a siloxane-containing nonionic surfactant such as a polyoxyalkylene-modified polysiloxane can be used in order to improve an ability for forming a fillet.

The surfactant may be used in an amount of about 1 parts by weight or less, for example, about 0.05 to about 0.5 parts by weight, based on 100 parts by weight of the total amounts of the composition, in terms of obtaining good viscosity of the composition, compatibility or dispersibility with the epoxy resin, and desirable properties of the cured material. A surfactant may be used alone or in combination of two or more kinds.

A silane coupling agent such as 3-glycidoxypropyl trimethoxy silane, 3-glycidoxypropyl (methyl)dimethoxy silane, 2-(2,3-epoxycyclohexyl)ethyltrimethoxy silane, 3-methacryloxypropyl trimethoxy silane, 3-aminopropyl triethoxy silane, 3-(2-aminoethyl)aminopropyl trimethoxy silane may be added to the disclosed underfill composition, for the purpose of improving adhesiveness.

A silane coupling agent may be used in an amount of about 3 parts by weight or less, for example, about 0.03 to about 2 parts by weight, based on 100 parts by weight of the total amounts of the underfill composition. A silane coupling agent may be used alone or in combination of two or more kinds.

A colorant such as carbon black may be added to the composition of the disclosed underfill composition.

A deformer, an inorganic fiber, a flame retarder, an ion trapping agent, an internal mold releasing agent, a sensitizer, and the like may be added to the composition of the disclosed underfill composition in an amount that does not impair the effects of the disclosed underfill composition.

In some examples, a polyester dispersing agent can be included in the disclosed underfill composition. Examples of polyester dispersing agents that can be used are those that are commercially available from King Industries, Inc., e.g., K-Sperse® series of dispersants such as K-Sperse 131, K-Sperse 152 and the like.

In general, the disclosed underfill composition can be prepared, for example, by mixing raw materials in predetermined amounts using, for example, a grinding machine, a pot mill, a triple roll mill, a rotary mixing machine, a biaxial mixer as generally known in the art.

In some examples, the disclosed underfill composition is in a liquid state at normal temperature, e.g., at about 10 degrees to about 35 degrees C., and has a viscosity at about 25 degrees C. of about 0.1 to about 150 Pas, alternately, about 0.1 to about 100 Pas. The viscosity can be measured at about 25 degrees C. by using a HB type rotational viscometer (SC4-14/6R spindle, rotation speed 50 rpm) made by Brookfield. As used herein, viscosity is a value determined at about 25 degrees C. by using the HB type rotary viscometer (50 rpm).

In some examples, the underfill composition that is in an uncured state is in a liquid state at normal temperature, e.g., at about 10 degrees to about 35 degrees C., and after being cured, in a solid state at normal temperature, e.g., at about 10 degrees to about 35 degrees C. The underfill composition that is in the uncured state can be cured, e.g., by heating for about an hour at between about 140 degrees C. and about 150 degrees C.

In some examples, the underfill composition that is in the cured state has a bulk thermal conductivity of greater than about 0.8 W/mK. The bulk thermal conductivity of the underfill composition can be measured by using laser flash or xenon flash, as is generally known in the art.

In some embodiments, the underfill composition can be a pre-applied underfill composition or a molded underfill composition. Components that can be included the pre-applied underfill composition or a molded underfill composition are provided in JP 2013-253135, JP 2013-185106, JP 2012-167138, JP 2012-167137, JP 2009-03292, JP 2009-96886, JP 2009-024099, JP 2008-303283, JP 2008-274083 and JP 2008-274080, which are incorporated herein by reference.

Assembly

In general, the disclosed underfill composition can be used in an assembly, e.g., an assembly 10 shown in FIG. 1. The assembly 10 includes a semiconductor die 23 and a substrate 85. The semiconductor die 23 can be any die that is suitable for use in an electronic device, for example, an IC die, an LSI die, a VLSI die and the like. The substrate 85 can be any substrate that is suitable for use in an electronic device, for example, a glass-epoxy substrate (e.g., a FR-4 substrate), an aramid substrate, a polyimide substrate, a metal substrate (e.g., a silicon substrate as a semiconductor), a ceramic substrate and the like.

In some examples, a bond line 78 is formed between the semiconductor die 23 and the substrate 85. An underfill composition 53 is provided in the bond line 78. In some instances, the bond line 78 has a thickness t1 of about 20 microns or less.

Figure 2:
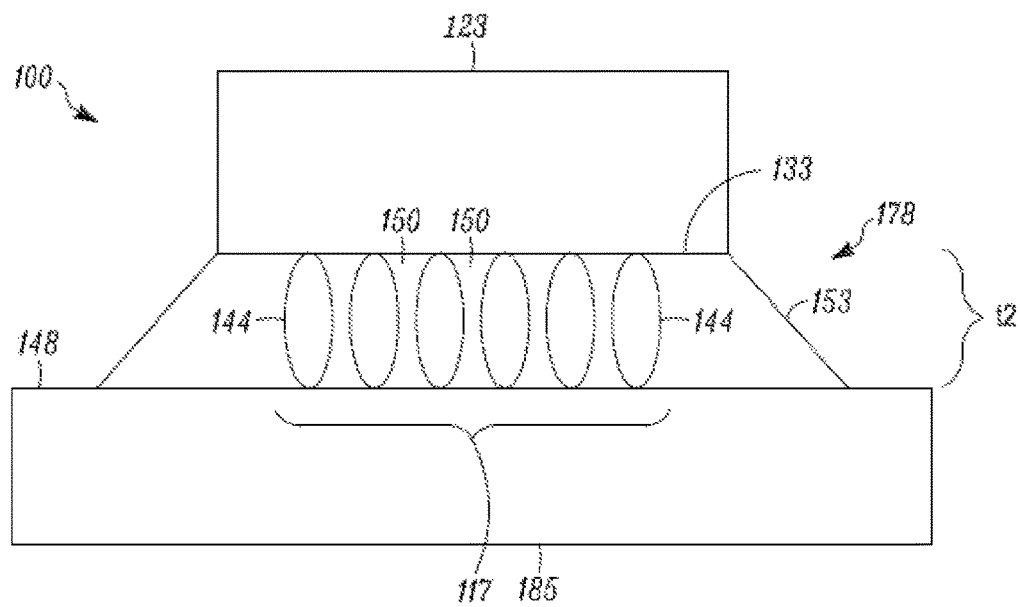
FIG. 2 is a schematic drawing of a flip chip semiconductor device that includes the disclosed underfill composition, according to one embodiment.

In one embodiment, the disclosed underfill composition can be used in an assembly, e.g., a flip chip semiconductor device 100 shown in FIG. 2. The flip chip semiconductor device 100 includes a semiconductor die 123 and a substrate 185, and can be similar to the semiconductor die 23 and the substrate 185, respectively, described above included in the assembly 10. The flip chip semiconductor device 100 further includes a ball grid array (BGA) or a bump array 117 on a face 133 of the semiconductor die 123. In some examples, the BGA or the bump array 117 includes solder balls 144. In some instances, the BGA or the bump array 117 is directly connected to a surface 148 of the substrate 185. In some examples, the BGA or the bump array 117 can exploit the full area of the device 100 for a relatively high number of electrical connections in the device 100.

In some examples, a bond line 178 is formed between the semiconductor die 123 and the substrate 185. An underfill composition 153 is provided in the bond line 178. In some instances, the bond line 178 has a thickness t2 of about 20 microns or less.

In some examples, the underfill composition 153 is provided in the spaces 150 between the solder balls 144 of the BGA or the bump array 117 and encapsulates the bond line 178.

Figure 3:
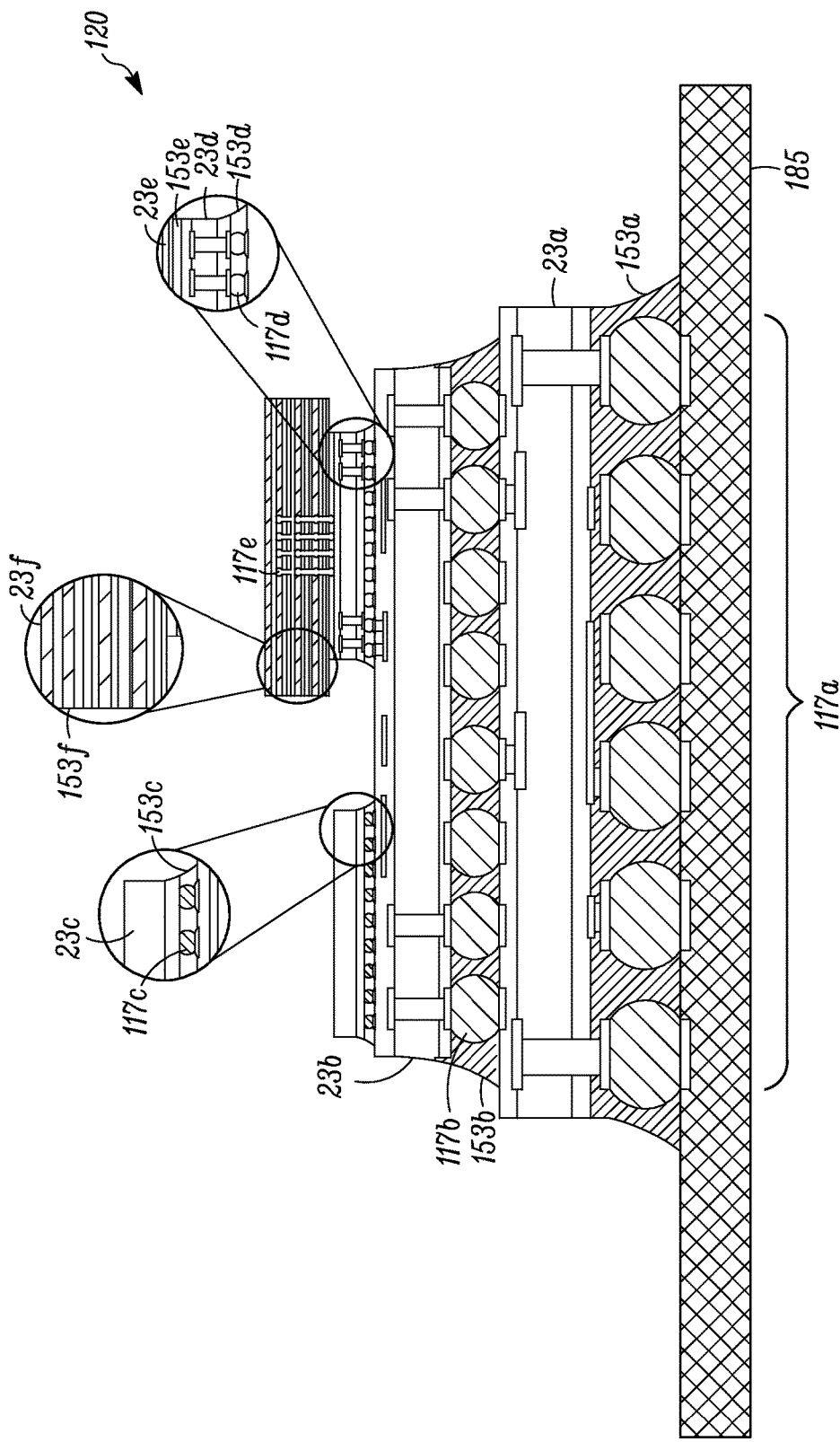
FIG. 3 is a schematic drawing of another assembly that includes the disclosed underfill composition, according to one embodiment.

It is to be appreciated that different configurations of the assembly including the disclosed underfill composition are possible. For instance, FIG. 3 depicts an assembly 120 having a multilayered packaging design. In particular, the assembly 120 includes the substrate 185, BGAs or bump arrays 117a, 117b, 117c, 117d, 117e, semiconductor dies 23a, 23b, 23c, 23d, 23e, 23f and underfill compositions 153a, 153b, 153c, 153d, 153e, 153f. Each of the BGAs or bump arrays 117a, 117b, 117c, 117d, 117e may have different dimensions from one another, and each of the semiconductor dies 23a, 23b, 23c, 23d, 23e, 23f may have different thicknesses from one another. Moreover, the type of underfill composition provided in each of the underfill compositions 153a, 153b, 153c, 153d, 153e, 153f may be the same or different from one another. For instance, each of the underfill compositions 153a, 153b, 153c, 153d, 153e, 153f may contain a capillary underfill composition, while each of the underfill compositions 153c, 153d, 153e, 153f may also contain one or more of a non-conductive film and a non-conductive paste.

Method of Using Underfill Composition

Figure 4:
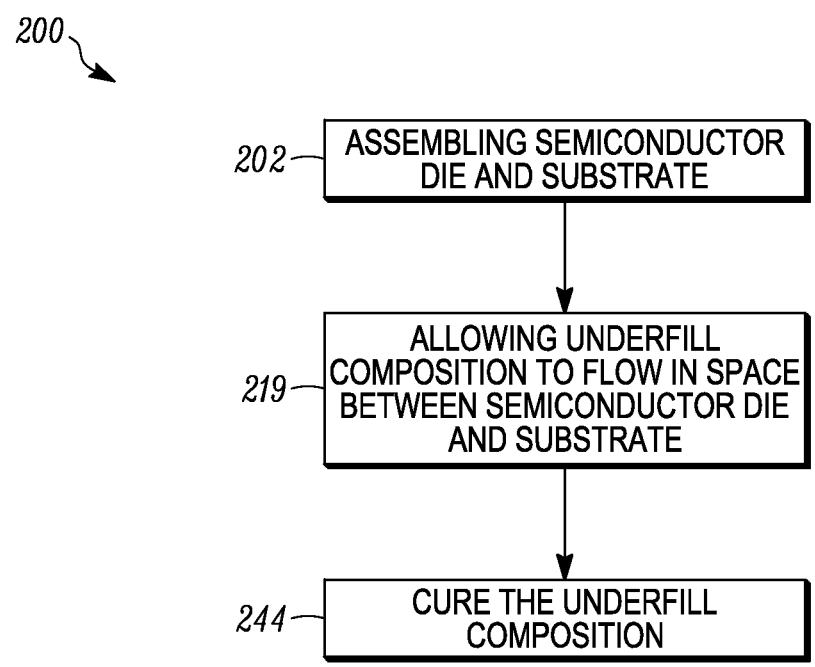
FIG. 4 is a flow chart of a method of using the underfill composition, according to one embodiment.

Referring to FIG. 4, in one embodiment, a method 200 for encapsulating a bond line 78, 178 includes assembling the semiconductor die 23, 123 and the substrate 85, 185 so that the semiconductor die 23, 123 is connected to the substrate 85, 185 (step 202), and then, allowing the underfill composition 53, 153 in the uncured state to flow in the space 78, 178 between the die 23, 123 and the substrate 85, 185 (step 219). In some examples, the method 200 further includes curing the underfill composition 53, 153 so as to encapsulate the bond line 78, 178 (step 244).

Fluidity Value

In general, a fluidity value of the underfill composition in an uncured state reflects the capability of the underfill composition to flow, e.g., via capillary action, in the space between the die and the substrate. A method of measuring the fluidity value of the underfill composition is described with reference to FIG. 5.

Figure 5:
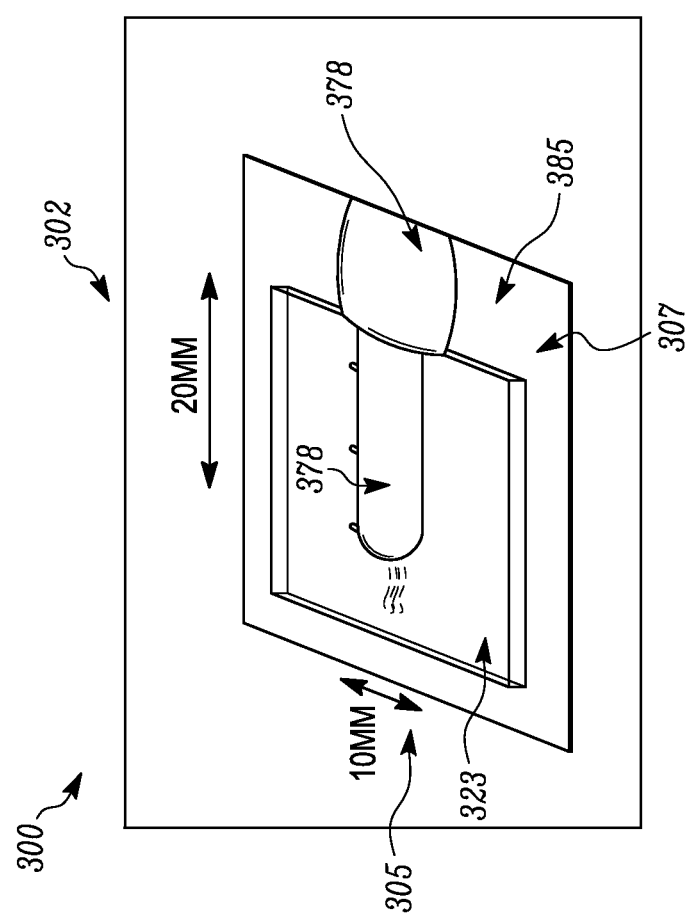
FIG. 5 is a schematic drawing of an assembly used for measuring a fluidity value of the disclosed underfill composition, according to one embodiment.

To measure a fluidity value of the underfill composition, an assembly 300 as shown in FIG. 5 is prepared. The assembly 300 includes a glass plate 323 and a FR-4 substrate 385 with a gap of 20 microns between the glass plate 323 and the FR-4 substrate 385. The assembly 300 is then placed on a hot plate set at about 90 degree C., and a sample of an uncured underfill composition 378 is spread on an end 307 of the substrate 385. The underfill composition 378 is then allowed to flow via capillary action between the glass plate 323 and the FR-4 substrate 385, and the time it takes for the underfill composition to travel a distance of two centimeters (302) with a width of one centimeter (305) is measured. The fluidity value is expressed in terms of an amount of time to travel a certain distance at a certain temperature within a certain bond line thickness.

EXAMPLES

Underfill compositions were prepared with the formulations shown in Tables 1-3 by mixing all of the components with a 3-roll mill. The fluidity values for the uncured underfill compositions were then measured in accordance with the accompanying description above for FIG. 5 at a bond line having a thickness of 20 microns or 50 microns. The bulk thermal conductivities of the cured underfill compositions were then measured. The results are provided in Tables 1-3.

The following are details of some of the components used.
YDF8170: bis-F epoxy by Tohto Kasei Co., Ltd.
YX8000: bis-A epoxy by Japan Epoxy Resins Co., Ltd.
Kayahard AA: 4,4'-Methylenebis(2-ethylaniline) by Nippon Kayaku Co., Ltd.
KBM 403: epoxy silane coupling agent by Shin-Etsu Chemical Co., Ltd.

TABLE 1

| components: | PC5-33-1 | | | | PC5-33-2 | | | |
| --- | --- | --- | --- | --- | --- | --- | --- | --- |
| | actual (g) | vol (cc) | vol % | % | actual (g) | vol (cc) | vol % | % |
| epoxy | | | | | | | | |
| YDF8170 | 2.705 | 2.705 | 38.8112 | 13.411 | 2.79 | 2.79 | 39.47386 | 13.769 |
| Kayahard AA | 1.244 | 1.244 | 17.8489 | 6.168 | 1.212 | 1.212 | 17.14778 | 5.942 |
| coupling agents | | | | | | | | |
| KBM 403 | 0.098 | 0.098 | 1.4061 | 0.486 | 0.104 | 0.104 | 1.471427 | 0.510 |
| dispersants | | | | | | | | |
| Disperbyk 111 | 0.096 | 0.096 | 1.3774 | 0.476 | | | | |
| K-Sparse 5100 | | | | | 0.108 | 0.108 | 1.52802 | 0.530 |
| K-flex XM B-301 | | | | | | | | |
| K-flex 7301 | | | | | | | | |
| fillers | | | | | | | | |
| LP Zinc-11 | | | | | 11.708 | 2.064903 | 29.21494 | 57.403 |
| LP Zinc-5 | | | | | | | | |
| LP Zinc-2 | 11.711 | 2.06543 | 29.6347 | 58.061 | 4.474 | 0.789065 | 11.16896 | 21.936 |
| Kadox 930 ZnO | 4.316 | 0.7612 | 10.9217 | 21.398 | | | | |
| SUM | 20.17 | 6.96963 | 100 | 100 | 20.396 | 7.067968 | 100 | 100 |
| Diffusivity (cm2/s) | 0.00781 | | | | 0.00861 | | | |
| Cp (J/gK) | 0.64 | | | | 0.64 | | | |
| density (g/cc) | 3.2365 | | | | 3.297 | | | |
| TC (W/mK): | 1.62 | | | | 1.82 | | | |
| gel pt. @150 C.: | 1'46"; 3'20" (4 wk) | | | | 2'28" 1'35" (4 wk) | | | |
| Die shear (kgf) | | | | | | | | |
| pre-PCT | 27.06 | | | | 23.81 | | | |
| post-PCT | 20.37 | | | | 20.71 | | | |
| fluidity @110 C. | | | | | | | | |
| 5 mm | 25" | | | | 1'50"; 2'55" (4 wk) | | | |
| 10 mm | 1'42" | | | | 2'25"; 10'50" (4 wk) | | | |
| 15 mm | 6'12" | | | | 4'13"; — (4 wk) | | | |
| 20 mm | — | | | | 5'13"; — (4 wk) | | | |
| | PC5-36-1 | | | | PC5-36-2 | | | |
| components | actual (g) | vol (cc) | vol % | % | actual (g) | vol (cc) | vol % | % |
| epoxy | | | | | | | | |
| YDF8170 | 2.761 | 2.761 | 39.4529 | 13.693 | 2.759 | 2.759 | 40.3975 | 14.406 |
| Kayahard AA | 1.203 | 1.203 | 17.1901 | 5.966 | 1.214 | 1.214 | 17.7755 | 6.339 |
| coupling agents | | | | | | | | |
| KBM 403 | 0.099 | 0.099 | 1.41464 | 0.491 | 0.1 | 0.1 | 1.46421 | 0.522 |
| dispersants | | | | | | | | |
| Disperbyk 111 | | | | | | | | |
| K-Sparse 5100 | | | | | | | | |

TABLE 1-continued

| | | | | | | | | |
|---|---|---|---|---|---|---|---|---|
| K-flex XM B-301 | 0.116 | 0.116 | 1.65756 | 0.575 | | | | |
| K-flex 7301 | | | | | 0.118 | 0.118 | 1.72777 | 0.616 |
| fillers | | | | | | | | |
| LP Zinc-11 | | | | | | | | |
| LP Zinc-5 | 11.639 | 2.05273 | 29.3322 | 57.722 | 10.334 | 1.82257 | 26.6863 | 53.958 |
| LP Zinc-2 | | | | | | | | |
| Kadox 930 ZnO | 4.346 | 0.76649 | 10.9526 | 21.553 | 4.627 | 0.81605 | 11.9487 | 24.159 |
| SUM | 20.164 | 6.99822 | 100 | 100 | 19.152 | 6.82962 | 100 | 102 |
| Diffusivity (cm2/s) | | | | | | | | |
| Cp (J/gK) | | | | | | | | |
| density (g/cc) | | | | | | | | |
| TC (W/mK): | | | | | | | | |
| gel pt. @150 C.: | 8'55" | | | | 6'35" | | | |
| Die shear (kgf) | | | | | | | | |
| pre-PCT | | | | | | | | |
| post-PCT | | | | | | | | |
| fluidity @110 C. | | | | | | | | |
| 5 mm | — | | | | — | | | |
| 10 mm | — | | | | — | | | |
| 15 mm | — | | | | — | | | |
| 20 mm | — | | | | — | | | |

TABLE 2

| | PC5-99-2 | | | | PC5-109-1 | | | |
|---|---|---|---|---|---|---|---|---|
| components: | actual (g) | vol (cc) | vol % | wt % | actual (g) | vol (cc) | vol % | wt % |
| Kayahard AA coupling agents | 1.677 | 1.677 | 16.909 | 8.335 | 1.663 | 1.663 | 16.8256 | 8.194 |
| KBM 403 dispersants | 0.101 | 0.101 | 1.01837 | 0.502 | 0.107 | 0.107 | 1.08258 | 0.527 |
| Disperbyk 180 filler | 0.197 | 0.197 | 1.98633 | 0.979 | 0.306 | 0.306 | 3.09599 | 1.508 |
| MA4 (1-3 um) diamond | 10.222 | 3.135582 | 31.6158 | 50.805 | 5.141 | 1.57899 | 15.9554 | 25.331 |
| Tokuyama H AlN ~1 um | | | | | | | | |
| ZrO2 TOSOH T2-5YS-E | | | | | | | | |
| SMO-S-1 MgO | | | | | 5.14 | 1.43575 | 14.5264 | 25.326 |
| Cerox 506 2 um ZnO | | | | | | | | |
| Kadox 911 ZnO | | | | | | | | |
| Kadox 920 | | | | | | | | |
| Kadox 930 ZnO | 3.783 | 0.6672 | 6.72727 | 18.802 | 3.816 | 0.67302 | 6.80931 | 18.803 |
| TOTAL | 20.12 | 9.91778 | 100 | 100 | 20.295 | 9.88376 | 100 | 100 |
| Diffusivity (cm2/s) | 0.00759 | | | | 0.00725 | | | |
| Cp (J/gK) | 0.81 | | | | 0.87 | | | |
| density (g/cc) | 1.9 | | | | 2.2 | | | |
| TC (W/mK): | 1.17 | | | | 1.38 | | | |
| gel pt. @150 C.: | 7'15" | | | | 7'48" | | | |
| Die shear (kgf) | | | | | | | | |
| pre-PCT | | | | | 13.97 | | | |
| post-PCT | | | | | 5.52 | | | |
| fluidity @110 C. | 50 um | | | 20 um | 50 um | | | 20 um |
| 5 mm | 47" | | | 29" | 1'13" | | | 18" |
| 10 mm | 1'20" | | | 1'58" | 2'17" | | | 58" |
| 15 mm | 2'25" | | | 4'40" | 3'41" | | | 2'22" |
| 20 mm | 7'05" | | | 9'01" | 5'19" | | | 4'33" |

| | PC5-111-1 | | | | PC5-111-2 | | | |
|---|---|---|---|---|---|---|---|---|
| components: | actual (g) | vol (cc) | vol % | wt % | actual (g) | vol (cc) | vol % | wt % |
| Kayahard AA coupling agents | 1.677 | 1.677 | 17.8825 | 8.257 | 1.806 | 1.806 | 17.9151 | 8.832 |
| KBM 403 dispersants | 0.117 | 0.117 | 1.24762 | 0.576 | 0.111 | 0.111 | 1.10109 | 0.543 |

TABLE 2-continued

| | | | | | | | | |
|---|---|---|---|---|---|---|---|---|
| Disperbyk 180 filler | 0.32 | 0.32 | 3.41229 | 1.576 | 0.325 | 0.325 | 3.22393 | 1.589 |
| MA4 (1-3 um) diamond | | | | | | | | |
| Tokuyama H AIN ~1 um | 5.134 | 1.57485 | 16.7932 | 25.277 | 5.124 | 1.57178 | 15.5917 | 25.059 |
| ZrO2 TOSOH T2-5YS-E | | | | | | | | |
| SMO-S-1 MgO | | | | | 5.126 | 1.43184 | 14.2036 | 25.068 |
| Cerox 506 2 um ZnO | 5.162 | 0.91041 | 9.70803 | 25.415 | | | | |
| Kadox 911 ZnO | 3.791 | 0.66861 | 7.12963 | 18.565 | | | | |
| Kadox 920 | | | | | 3.789 | 0.66825 | 6.62893 | 18.530 |
| Kadox 930 ZnO | | | | | | | | |
| TOTAL | 20.311 | 9.37786 | 100 | 100 | 20.448 | 10.0809 | 100 | 100 |
| Diffusivity (cm2/s) | 0.00648 | | | | 0.00747 | | | |
| Cp (J/gK) | 0.78 | | | | 0.87 | | | |
| density (g/cc) | 2.16 | | | | 2.16 | | | |
| TC (W/mK): | 1.10 | | | | 1.41 | | | |
| gel pt. @150 C.: | 7'20" | | | | 7'24" | | | |
| Die shear (kgf) | | | | | | | | |
| pre-PCT | 16.34 | | | | 16.37 | | | |
| post-PCT | 13.03 | | | | 7.81 | | | |
| fluidity @110 C. | 50 um | | | 20 um | 50 um | | | 20 um |
| 5 mm | 1'02" | | | 13" | 55" | | | 16" |
| 10 mm | 2'01" | | | 54" | 1'58" | | | 1'10" |
| 15 mm | 3'03" | | | 2'37" | 3'59" | | | 2'50" |
| 20 mm | 4'36" | | | 5'19" | 6'43" | | | 5'03" |

TABLE 3

| | PC5-113-2 | | | | PC5-116-2 | | | |
|---|---|---|---|---|---|---|---|---|
| components: | actual (g) | vol (cc) | vol % | wt % | actual (g) | vol (cc) | vol % | wt % |
| Kayahard AA coupling agents | 1.707 | 1.707 | 17.3905 | 8.407 | 1.697 | 1.697 | 15.2952 | 6.847 |
| KBM 403 dispersants | 0.135 | 0.135 | 1.37535 | 0.665 | 0.111 | 0.111 | 1.00045 | 0.448 |
| Disperbyk 180 filler | 0.316 | 0.316 | 3.21933 | 1.556 | 0.317 | 0.317 | 2.85714 | 1.279 |
| MA4 (1-3 um) diamond | 5.147 | 1.46222 | 14.8967 | 25.348 | | | | |
| Tokuyama H AIN ~1 um | | | | | 6.767 | 2.07577 | 18.709 | 27.303 |
| ZrO2 TOSOH T2-5YS-E | | | | | | | | |
| SMO-S-1 MgO | 5.139 | 1.43547 | 14.6243 | 25.309 | 6.778 | 1.8933 | 17.0644 | 27.347 |
| Cerox 506 2 um ZnO | | | | | | | | |
| Kadox 911 ZnO | | | | | | | | |
| Kadox 920 | 3.765 | 0.66402 | 6.76488 | 18.542 | 4.995 | 0.88095 | 7.94007 | 20.153 |
| Kadox 930 ZnO | | | | | | | | |
| TOTAL | 20.305 | 9.81571 | 100 | 100 | 24.785 | 11.095 | 100 | 100 |
| Diffusivity (cm2/s) | 0.00627 | | | | 0.00806 | | | |
| Cp (J/gK) | 0.83 | | | | 0.54 | | | |
| density (g/cc) | 2.193 | | | | 2.467 | | | |
| TC (W/mK): | 1.14 | | | | 1.67 | | | |
| gel pt. @150 C.: | 6'05" | | | | 9'25" | | | |
| Die shear (kgf) | | | | | | | | |
| pre-PCT | 16.18 | | | | 16.16 | | | |
| post-PCT | 15.78 | | | | 7.51 | | | |
| fluidity @110 C. | 50 um | | | 20 um | 50 um | | | 20 um |
| 5 mm | 50" | | | 18" | 1'15" | | | 46" |
| 10 mm | 2'03" | | | 1'14" | 2'37" | | | 2'09" |
| 15 mm | 3'45" | | | 3'02" | 4'52" | | | 5'03" |
| 20 mm | 5'58" | | | 5'40" | 8'45" | | | 9'48" |

| | PC5-117-1 | | | | PC5-119-2 | | | |
|---|---|---|---|---|---|---|---|---|
| components | actual (g) | vol (cc) | vol % | wt % | actual (g) | vol (cc) | vol % | wt % |
| Kayahard AA coupling agents | 1.092 | 1.092 | 15.4164 | 6.438 | 1.698 | 1.698 | 17.6178 | 8.358 |

TABLE 3-continued

| | | | | | | | | |
|---|---|---|---|---|---|---|---|---|
| KBM 403 dispersants | 0.118 | 0.118 | 1.66587 | 0.696 | 0.108 | 0.108 | 1.12057 | 0.532 |
| Disperbyk 180 filler | 0.305 | 0.305 | 4.30585 | 1.798 | 0.312 | 0.312 | 3.23719 | 1.538 |
| MA4 (1-3 um) diamond | | | | | | | | |
| Tokuyama H AlN ~1 um | 4.642 | 1.42393 | 20.1024 | 27.365 | 3.135 | 0.96166 | 9.97778 | 15.450 |
| ZrO2 TOSOH T2-5YS-E | | | | | 2.021 | 0.35581 | 3.69175 | 9.960 |
| SMO-S-1 MgO | | | | | 5.122 | 1.43073 | 14.8447 | 25.243 |
| Cerox 506 2 um ZnO | 4.658 | 0.82152 | 11.5978 | 27.460 | | | | |
| Kadox 911 ZnO | | | | | | | | |
| Kadox 920 | | | | | | | | |
| Kadox 930 ZnO | 3.43 | 0.60494 | 8.54025 | 20.220 | 3.792 | 0.66878 | 6.93904 | 18.688 |
| TOTAL | 16.963 | 7.08338 | 100 | 100 | 20.201 | 9.63798 | 100 | 100 |
| Diffusivity (cm2/s) | 0.00801 | | | | 0.00549 | | | |
| Cp (J/gK) | 0.74 | | | | 0.87 | | | |
| density (g/cc) | 2.55 | | | | 2.21 | | | |
| TC (W/mK): | 1.52 | | | | 1.05 | | | |
| gel pt. @150 C.: | 6'43" | | | | 9'30" | | | |
| Die shear (kgf) | | | | | | | | |
| pre-PCT | 16.64 | | | | 12.91 | | | |
| post-PCT | 12.24 | | | | 10.87 | | | |
| fluidity @110 C. | 50 um | | 20 um | | 50 um | | | 20 um |
| 5 mm | 50" | | 20" | | 52" | | | 29" |
| 10 mm | 1'47" | | 1'30" | | 1'55" | | | 1'27" |
| 15 mm | 3'15" | | 4'08" | | 3'11" | | | 3'24" |
| 20 mm | 6'12" | | 8'40" | | 5'28" | | | 6'24" |

In the above tables, Table 1 includes comparative examples (PC5-33-1, PC5-33-2, PC5-36-1, and PC5-36-2), while Tables 2 and 3 include examples in accordance with the present invention (PC5-99-2, PC5-111-1, PC5-111-2, PC5-109-1, PC5-113-2, PC5-117-1, PC5-119-1 and PC5-116-2). In the comparative examples, no fluidity was observed at a 20 micron bond line. There was some fluidity observed at a 50 micron bond line for PC5-33-1 and PC5-33-2, but PC5-33-1 stopped flowing after 15 mm. On the other hand, each of the examples in accordance with the present invention had a fluidity value of less than about ten minutes over about a two centimeter distance at a temperature of about 90 degrees C. and at a bond line having a thickness of about 20 microns, and a bulk thermal conductivity of over 0.8 W/mK.

Aspects

Any one of aspects 1-16 can be combined with any one of aspects 17-22. Aspect 23 can be combined with any one of aspects 2-22.

Aspect 1. An underfill composition for encapsulating a bond line having a thickness of about 50 microns or less, comprising:
  an epoxy resin;
  a curing agent; and
  a plurality of filler particles,
  wherein the filler particles have a maximum particle size of about 3 microns, a bimodal or trimodal particle size distribution, and have an aspect ratio of about one.

Aspect 2. The underfill composition of any one of aspects 1 and 3-16, wherein the filler particles have an electrical resistance of between about $10^{10}$ Ohm·cm and about $10^{15}$ Ohm·cm.

Aspect 3. The underfill composition of any one of aspects 1-2 and 4-16, wherein the filler particles have an electrical resistance of greater than about $10^{12}$ Ohm·cm.

Aspect 4. The underfill composition of any one of aspects 1-3 and 5-16, wherein a bulk thermal conductivity of the filler particles is more than about 20 W/mK.

Aspect 5. The underfill composition of any one of aspects 1-4 and 6-16, wherein the bulk thermal conductivity of the underfill composition in the cured state is about 0.8 W/mK to about 20 W/mK.

Aspect 6. The underfill composition of any one of aspects 1-5 and 7-16, wherein the filler particles include an oxide.

Aspect 7. The underfill composition of any one of aspects 1-6 and 8-16, wherein the oxide is at least one selected from the group consisting of aluminum oxide, zinc oxide, beryllium oxide, zirconium oxide and magnesium oxide.

Aspect 8. The underfill composition of any one of aspects 1-7 and 9-16, wherein the filler particles include a nitride.

Aspect 9. The underfill composition of any one of aspects 1-8 and 10-16, wherein the nitride is at least one selected from the group consisting of aluminum nitride, boron nitride and silicon nitride.

Aspect 10. The underfill composition of any one of aspects 1-9 and 11-16, wherein the filler particles include diamond.

Aspect 11. The underfill composition of any one of aspects 1-10 and 12-16, wherein the filler particles have a spherical shape.

Aspect 12. The underfill composition of any one of aspects 1-11 and 13-16, wherein the filler particles have a cubical shape with round corners.

Aspect 13. The underfill composition of any one of aspects 1-12 and 14-16, wherein the underfill composition is a capillary underfill composition, wherein the capillary underfill composition in an uncured state has a fluidity value that is less than about ten minutes over about a two centimeter distance at a temperature of about 90 degrees C. within a bond line having a thickness of about 20 microns, and wherein the capillary underfill composition in a cured state has a bulk thermal conductivity that is greater than about 0.8 W/mK.

Aspect 14. The underfill composition of any one of aspects 1-13 and 15-16, wherein the filler particles are blended from two particle size distributions having respective D50 particle size distributions of about 0.5 and about 3.0.

Aspect 15. The underfill composition of any one of aspects 1-14 and 16, wherein the filler particles are blended from three particle size distributions having respective D50 particle size distributions of about 0.1, about 0.5 to about 1.0, and about 2.0 to about 3.0.

Aspect 16. The underfill composition of any one of aspects 1-15, wherein the underfill composition is a pre-applied underfill composition or a molded underfill composition.

Aspect 17. A method for encapsulating a bond line, comprising:
(1) applying the underfill composition of claim 1 in a bond line of a substrate; and
(2) curing the underfill composition applied in (1), wherein the bond line has a thickness of 50 microns or less; and wherein the underfill composition applied in (1) has a fluidity value that is less than about ten minutes over about a two centimeter distance at a temperature of about 90 degrees C.

Aspect 18. The method of claim any one of aspects 17 and 19-20, wherein the bond line is formed between the substrate and a semiconductor.

Aspect 19. The method of any one of aspects 17-18 and 20, wherein in (1), wherein the underfill composition is applied using capillary action.

Aspect 20. The method of any one of aspects 17-19, wherein the bond line has a thickness of 20 microns or less.

Aspect 21. A flip chip semiconductor device, comprising:
a substrate;
a semiconductor die having a ball grid array or a bump array; and
an underfill composition in accordance with any one of aspects 1-16 that is provided between the substrate and the semiconductor die.

Aspect 22. An assembly, comprising:
a printed circuit substrate;
a semiconductor die; and
an underfill composition in accordance with any one of aspects 1-16 that is provided between the printed circuit substrate and the semiconductor die.

Aspect 23. A capillary underfill composition for encapsulating a bond line having a thickness of about 20 microns or less, comprising:
an epoxy resin;
a curing agent; and
a plurality of filler particles,
wherein the filler particles have a maximum particle size of about 3 microns, a bimodal or trimodal particle size distribution, and have an aspect ratio of about one,
wherein the underfill composition in an uncured state has a fluidity value that is less than about ten minutes over about a two centimeter distance at a temperature of about 90 degrees C. within a bond line having a thickness of about 20 microns, and
wherein the underfill composition in a cured state has a bulk thermal conductivity that is greater than about 0.8 W/mK.

While the disclosed composition and methods have been described in conjunction with some particular embodiments, it will be apparent to one skilled in the art that other objects and refinements of the disclosed composition and methods may be made within the purview and scope of the disclosure. The disclosure, in its various aspects and disclosed forms, is well adapted to the attainment of the advantages of others. The disclosed details are not to be taken as limitations on the claims.

What is claimed is:

1. An underfill composition for encapsulating a bond line having a thickness of 50 microns or less, comprising:
an epoxy resin;
a curing agent; and
a plurality of filler particles,
wherein the filler particles have a maximum particle size of about 3 microns, a trimodal particle size distribution, and have an aspect ratio of about one,
wherein the underfill composition in an uncured state has a fluidity value that is less than about ten minutes over about a two centimeter distance at a temperature of about 90 degrees C. within a bond line having a thickness of about 50 microns, wherein the underfill composition in a cured state has a bulk thermal conductivity that is greater than about 0.8 W/mK,
wherein the filler particles include zinc oxide, and
wherein the particle size of the zinc oxide is between about 0.2 microns and 2.0 microns, and the amount of the zinc oxide is between 5 to 15 vol %.

2. The underfill composition of claim 1, wherein the filler particles have a resistivity of between $10^{10}$ Ohm.cm and $10^{15}$ Ohm.cm.

3. The underfill composition of claim 1, wherein the filler particles have a resistivity of greater than or equal to $10^{12}$ Ohm.cm.

4. The underfill composition of claim 1, wherein a bulk thermal conductivity of the filler particles is more than or equal to 20 W/mK.

5. The underfill composition of claim 1, wherein the bulk thermal conductivity of the underfill composition in the cured state is between 0.8 W/mK to 20 W/mK.

6. The underfill composition of claim 1, wherein the filler particles further comprise at least one selected from the group consisting of aluminum oxide, beryllium oxide, zirconium oxide and magnesium oxide.

7. The underfill composition of claim 1, wherein the filler particles include a nitride.

8. The underfill composition of claim 7, wherein the nitride is at least one selected from the group consisting of aluminum nitride, boron nitride and silicon nitride.

9. The underfill composition of claim 1, wherein the filler particles include diamond.

10. The underfill composition of claim 1, wherein the filler particles have a spherical shape or a cubical shape with round corners.

11. The underfill composition of claim 1, wherein the underfill composition in an uncured state has a fluidity value that is less than or equal to ten minutes over about a two centimeter distance at a temperature of about 90 degrees C. within a bond line having a thickness of about 20 microns.

12. The underfill composition of claim 1, wherein the underfill is a capillary underfill, a pre-applied underfill or a molded underfill.

13. The underfill composition of claim 1, wherein the filler particles are blended from two particle size distributions having respective D50 particle size distributions of about 0.5 and about 3.0.

14. The underfill composition of claim 1, wherein the filler particles are blended from three particle size distributions having respective D50 particle size distributions of about 0.1, about 0.5 and between 2.5-3.0.

15. The underfill composition of claim 1, further comprising a polyester dispersing agent.

16. A method for encapsulating a bond line, comprising:
(1) applying the underfill composition of claim 1 in a bond line of a substrate; and (2) curing the underfill composition applied in (1),
wherein the bond line has a thickness of 50 microns or less; and
wherein the underfill composition applied in (1) has a fluidity value that is less than or equal to ten minutes over about a two centimeter distance at a temperature of about 90 degrees C.

17. The method of claim 16, wherein the bond line is formed between the substrate and a semiconductor.

18. The method of claim 16, wherein in (1), the underfill is applied using capillary action.

19. The method of claim 16, wherein the bond line has a thickness of 5 microns or more.

\* \* \* \* \*